(12) United States Patent
Rhode et al.

(10) Patent No.: US 6,492,928 B1
(45) Date of Patent: Dec. 10, 2002

(54) DIGITAL-TO-ANALOG CONVERTER WITH POWER UP/DOWN TRANSIENT SUPPRESSION AND AUTOMATIC RATE SWITCHING

(75) Inventors: Jason P. Rhode, Austin, TX (US); John J. Paulos, Austin, TX (US); Andrew W. Krone, Austin, TX (US); Richard Bocock, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 40 days.

(21) Appl. No.: 09/908,672

(22) Filed: Jul. 18, 2001

Related U.S. Application Data

(62) Division of application No. 08/941,566, filed on Sep. 30, 1997, now Pat. No. 6,281,821.

(51) Int. Cl.$^7$ ............................................. H03M 1/66
(52) U.S. Cl. .................................... 341/144; 341/135
(58) Field of Search .................................. 341/144, 135, 341/118; 381/94.1, 94.4; 306/306; 327/321

(56) References Cited

U.S. PATENT DOCUMENTS

| | | | |
|---|---|---|---|
| 4,695,804 A | * 9/1987 | Bardl et al. | 328/14 |
| 6,005,896 A | * 12/1999 | Maruyama | 375/295 |
| 6,153,997 A | * 11/2000 | Kobayashi et al. | 318/560 |
| 6,236,724 B1 | * 5/2001 | Labaton et al. | 379/355 |

* cited by examiner

Primary Examiner—Peguy Jeanpierre
(74) Attorney, Agent, or Firm—Blakely Sokoloff Taylor & Zaffman LLP

(57) ABSTRACT

Power-up and power-down transient suppression are provided for an audio digital-to-analog converter with a single ended output to prevent annoying pops which accompany switching an audio system on and off. Power-up suppression is achieved by clamping an output signal to ground, driving the audio channel to ground, releasing the clamp and driving the audio channel gradually to its quiescent (zero signal) value. Power-down suppression is provided by using a positive feedback amplifier to accelerate current drain initiated by a constant current source used to bleed off the charge on output capacitor. The audio digital-to-analog converter sets operational mode based on ratios of a master clock to a channel selection clock. The techniques disclosed apply readily to the outputs received from CDs, CD-ROMs, DAT and other digital recording media.

15 Claims, 11 Drawing Sheets

| LRCK (kHz) | MCLK (MHz) | | | | | |
|---|---|---|---|---|---|---|
| | HRM | | | BRM | | |
| | 128x | 192x | 256x | 384x | 512x | |
| 32 | 4.0960 | 6.1440 | 8.1920 | 12.2880 | 16.3840 |
| 44.1 | 5.6448 | 8.4672 | 11.2896 | 16.9344 | 22.5792 |
| 48 | 6.1440 | 9.2160 | 12.2880 | 18.4320 | 24.5760 |
| 64 | 8.1920 | 12.2880 | N/A | N/A | N/A |
| 88.2 | 11.2896 | 16.9344 | N/A | N/A | N/A |
| 96 | 12.2880 | 18.4320 | N/A | N/A | N/A |

FIG. 4

DIGITAL-TO-ANALOG CONVERTER WITH POWER UP/DOWN TRANSIENT SUPPRESSION AND AUTOMATIC RATE SWITCHING

This application is a division of U.S. patent application Ser. No. 08/941,566, entitled "Digital-To-Analog Converter With Power Up/Down Transient Suppression And Automatic Rate Switching," filed Sep. 30, 1997, now U.S. Pat. No. 6,281,821.

BACKGROUND OF THE INVENTION

1. Field of the Invention

The invention relates to switched capacitor digital-to-analog converters, and, more particularly, to switched capacitor digital-to-analog converters with power-up/down transient suppression for use in audio systems.

2. Description of Related Art

A number of digital sources of audio information are known. These include compact disk players, digital audio tape, digital transmissions and the like. Stereo digital-to-analog converters are also known, which convert the output from such digital sources into analog information for playback. It is common, when dealing with such stereo digital-to-analog converters, that they have a single ended output ranging between a ground or return value and a supply voltage level with a nominal or quiescent value, $V_q$, when no signal is applied. It is common in single ended output systems to use a D.C. blocking capacitor to provide a ground centered signal for subsequent processing.

Single-ended digital-to-analog converters (DACs) powered from a single supply can suffer from large transient signals appearing at the outputs when initially powered on. Such DACs present an analog output centered on a nominal quiescent operating voltage, $V_q$. The transient occurs when power is applied to the part, and the analog outputs are required to move from ground to $V_q$. If this transient occurs rapidly, it can be approximated as a step function, which has energy at all frequencies. On power-up, such a system can suffer an annoying "POP" at the speaker as the DAC initially charges the D.C. blocking capacitor to $V_q$.

A similar click or pop can occur when the system is powered off. On entering the power-down state, the charge on the D.C. blocking capacitor remains. When power is removed, the residual charge on the D.C. blocking capacitor discharges rapidly across the load resister resulting in a loud pop.

SUMMARY OF THE INVENTION

In accordance with the invention, digital-to-analog converters provide power-up pop/click transient suppression utilizing a digital transient generator which operates to replace the pop or click, which would otherwise occur, with a smooth transition.

In accordance with another aspect of the invention, a digital-to-analog converter suppresses a pop or a click which would otherwise occur when the DAC is powered down using a current source and a positive feedback amplifier.

In accordance with another aspect of the invention, a digital-to-analog converter automatically switches from a base rate mode to a high rate mode by detecting the ratio of the master clock to the left/right clock.

BRIEF DESCRIPTION OF THE DRAWINGS

The objects, features and advantages of the system of the present invention will be apparent from the following description in which:

FIG. 4 is a table showing exemplary relationships between MCLK and LRCK as a function of sample rate and mode.

DESCRIPTION OF THE PREFERRED EMBODIMENT

Figure 1:
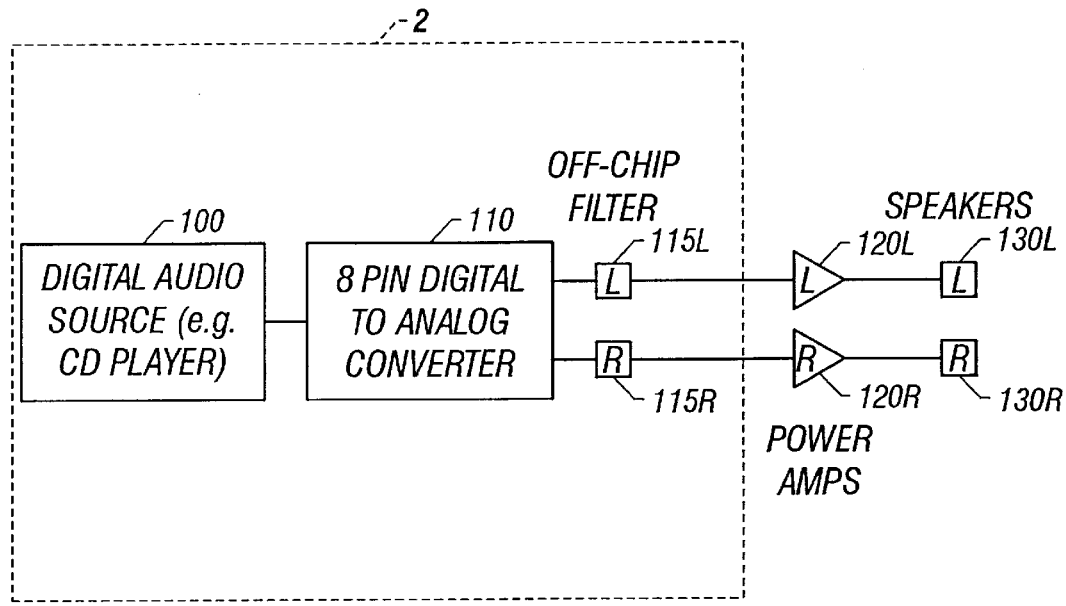
FIG. 1 is a block diagram of an exemplary stereo system using a digital-to-analog converter in accordance with one embodiment of the invention.

FIG. 1 is a block diagram of an exemplary stereo system using a digital-to-analog converter in accordance with one embodiment of the invention.

A digital audio source, such as a CD player or digital audio tape player provides output signals to an eight pin digital-to-analog converter 110 where the digital signals from the digital audio source 100 are converted into respective analog outputs, one for a left channel and one for a right channel, which are respectively fed to off-chip filters 115L and 115R. The output of those filters are fed to power amplifiers 120L and 120R respectively and from there to respective speakers 130L and 130R for reproduction for listening. The portion of the circuitry shown in the dashed box in FIG. 1 is illustrated in more detail in FIG. 2.

Figure 2:
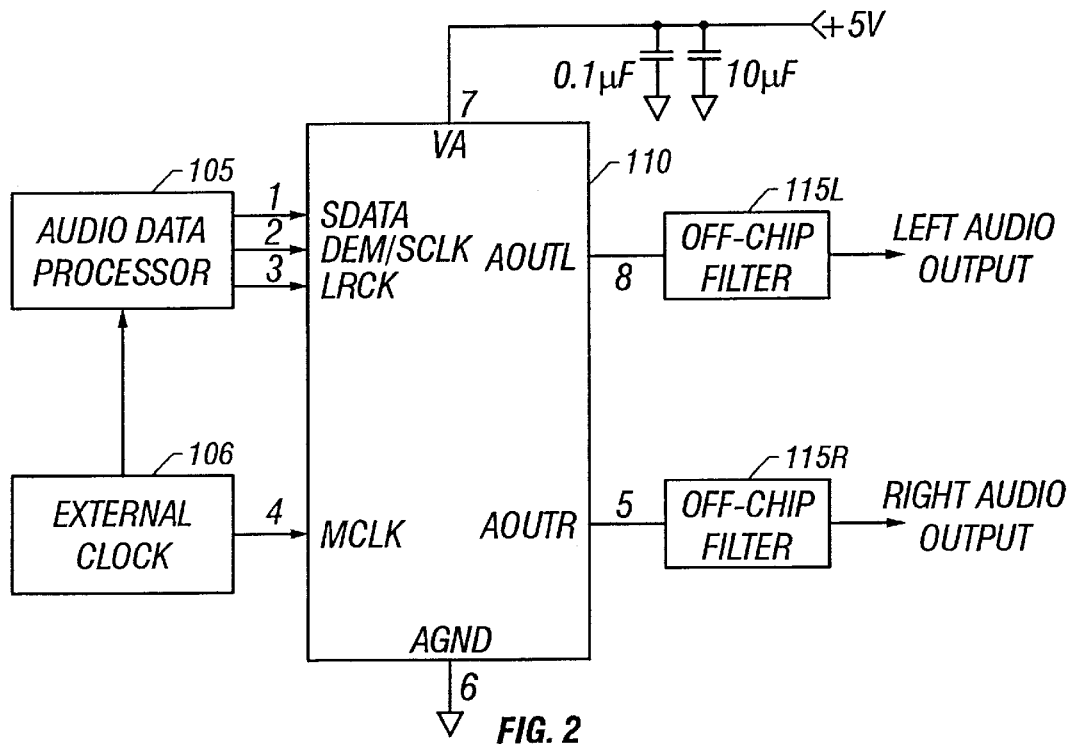
FIG. 2 is a block diagram showing a portion of the system of FIG. 1 including an exemplary eight pin digital-to-analog converter in more detail.

Referring to FIG. 2, the eight pin digital-to-analog converter 110 and the off-chip filters 115L and 115R correspond to the same components shown in FIG. 1. The audio data processor 105 is part of digital audio source 100 shown in FIG. 1. The external clock 106 is similarly provided from the digital audio source 100 in this particular implementation. An external clock can, of course, be provided separately. The audio data processor 105 provides three signals to the eight pin digital-to-analog converter 110. The SDATA signal coming in on pin 1 from the audio data processor 105 constitutes the actual sample values to be reproduced at the audio outputs.

Pin 2 receives one of two signals from the audio data processor 105. If an external serial clock (SCLK) signal is utilized, it is applied to pin 2 and used to write the serial data (SDATA) signals into a receiving buffer. If an external SCLK signal is not received over pin 2, an SCLK signal will be generated internally. If pin 2 is not utilized for an SCLK signal, then it may be utilized for switching in or out a de-emphasis circuit selectively utilized to improve signal to noise ratio.

The left-right clock (LRCK) comes in over pin 3. The LRCK alternates between an indication that the SDATA belongs to the left channel and that SDATA belongs to the right channel. This signal is utilized to route incoming data to the proper channel. The master clock (MCLK) comes in over pin 4 of the digital-to-analog converter 110 and pin 7 receives a capacitor smoothed power supply. The power return or ground connects over pin 6. Pins 8 and 5 constitute the left and right audio output signals AOUTL and AOUTR, respectively. The signals on pins 8 and 5 are filtered by off-chip filters 115L and 115R, respectively from which the left audio output and right audio output are taken.

Figure 3A:
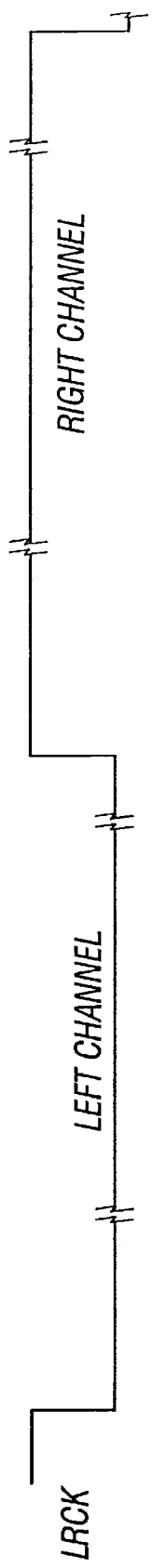
FIGS. 3A–3C collectively represent a timing diagram showing an exemplary relationship between LRCK and SCLK and one arrangement of SDATA.
Figure 3B:
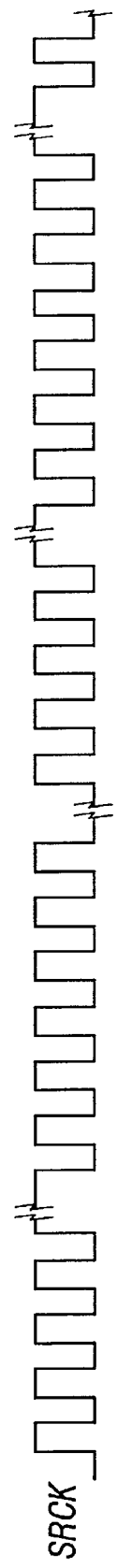
Figure 3C:
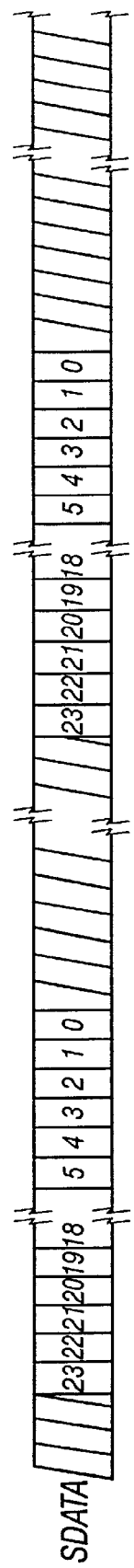

FIGS. 3A–3C collectively represent a timing diagram showing an exemplary relationship between LRCK and SCLK and one arrangement of SDATA. The LRCK is shown in FIG. 3A. It alternates between a state indicating the left channel and a state indicating the right channel on a regular basis. FIG. 3B shows the SCLK data utilized to receive the SDATA. FIG. 3C illustrates two 24-bit packets of SDATA information being received for the left and right channels, respectively. Notice that the number of bits that can be sent during a left channel or a right channel can be greater than the 24-bits shown. A number of different formats for SDATA are possible. In the examples shown in FIG. 3C, the 24-bits of information from SDATA are shown to be left justified within the left channel and right channel windows, respectively. One common alternative format is to right justify the SDATA information within the left and right channel windows. Whatever the particular alignment of the SDATA information within the left channel and right channel windows is, a digital-to-analog converter accommodates it.

FIG. 4 is a table showing exemplary relationships between MCLK and LRCK as a function of sample rate and mode. The switched capacitor digital-to-analog converter described herein accepts data at standard audio sampling rates including 48, 44.1 and 32 kHz in a base rate mode (BRM). Sampling rates of 96, 88.2 and 64 kHz can be accommodated in a high rate mode (HRM).

Audio data is input via the serial data input pin (SDATA) the left/right clock (LRCK) defines the channel and delineation of data and the serial clock (SCLK) clocks audio data into the input data buffer. Different versions of the chip can accommodate different serial data formats. The master clock (MCLK) is used to operate the digital interpolation filter and the delta sigma modulator.

MCLK must be either 256X, 384X or 512X the desired input sample rate in base rate mode and either 128X or 192X in high rate mode. The LRCK frequency is equal to $F_s$, the frequency at which words for each channel are input to the device. The MCLK-to-LRCK frequency ratio is detected automatically during the initialization sequence by counting the number of MCLK transitions during a single LRCK period and used to set the mode. FIG. 4 reflects several standard audio sample rates and the required MCLK and LRCK frequencies and illustrates the mode utilized to accommodate those.

The serial clock SCLK controls the shifting of data into input data buffers. Both external and internal serial clock generation modes are supported. Chip 110 will enter the external serial clock mode when 16 low to high transitions are detected on the DEM/SCLK pin during any phase of the LRCK period. When this mode is enabled, the internal serial clock mode and de-emphasis filter cannot be accessed. The chip will switch to internal serial clock mode if no low to high transitions are detected on the DEM/SCLK pin for two consecutive frames of LRCK.

Figure 5:
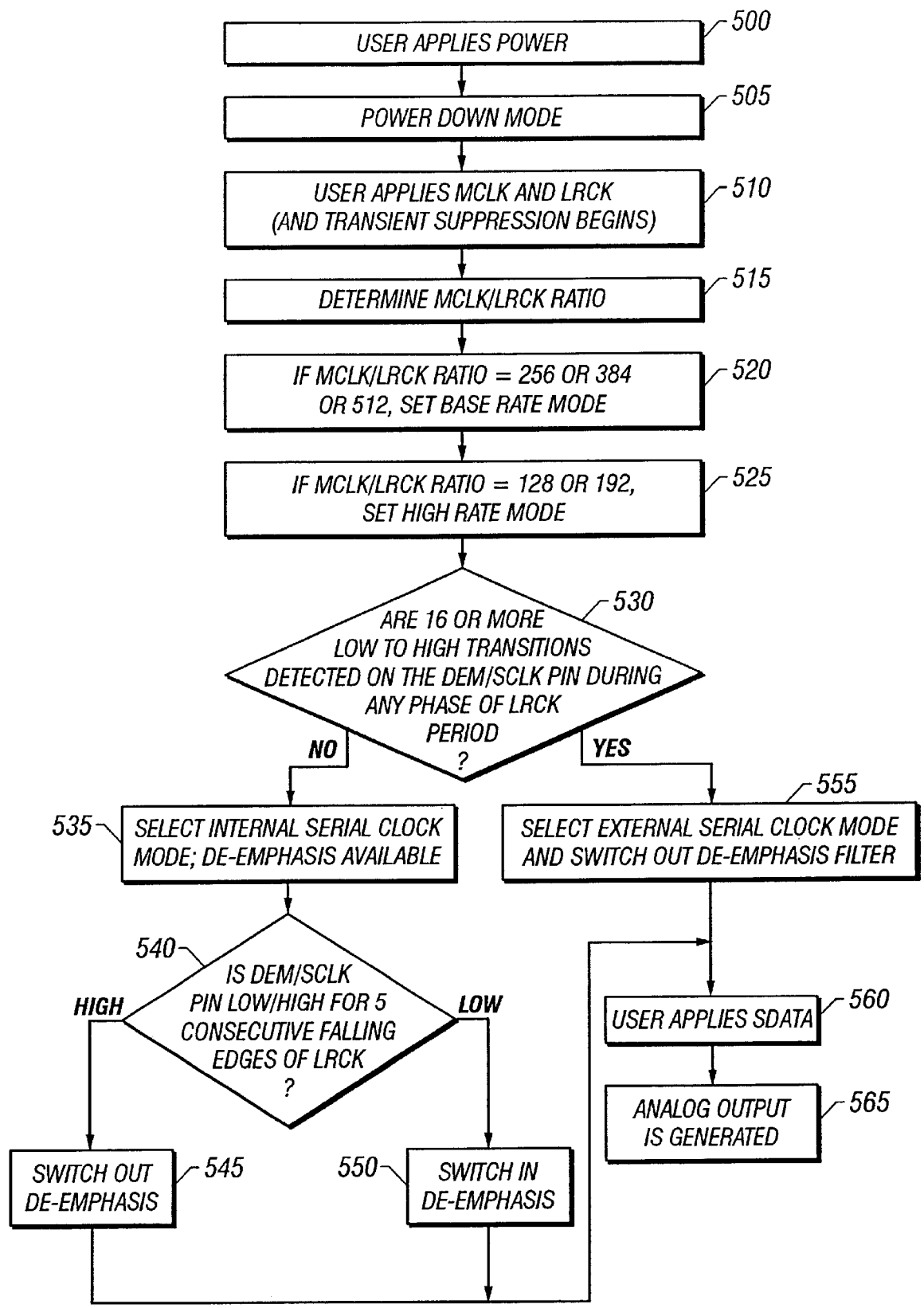
FIG. 5 is a flow chart showing an exemplary power-up sequence for an eight pin digital-to-analog converter shown in FIG. 2.

FIG. 5 is a flow chart showing an exemplary power-up sequence for an eight pin digital-to-analog converter 110 shown in FIG. 2. When the user applies external power 500, chip 110 enters the power-down mode 505. In the power-down state, power is still available to the chip, but the interpolation filters and delta sigma modulators are reset and the internal voltage reference, one bit switched capacitor digital-to-analog converters and low-pass filters are powered down. The chip 110 remains in the power down mode until MCLK and LRCK are present. Once MCLK and LRCK are detected, MCLK occurrences are counted over one LRCK period to determine the MCLK/LRCK frequency ratio. Power is then applied to the internal voltage reference (510) and transient suppression begins. Finally, power is applied to the DAC's and switched capacitor filters and the analog outputs will ramp to the quiescent voltage $V_q$.

The ratio MCLK divided by LRCK (515) is used to determine mode. If the ratio equals 256 or 384 or 512, the base rate mode is selected (520). If the ratio is 128 or 192, high rate mode is selected (525). Either sequentially or simultaneously pin 2 of chip 110 is checked to determine whether 16 or more low to high transitions are detected on the DEM/SCLK pin during any phase of an LRCK (530). If they are, external clock mode will be selected and access to the de-emphasis filter will not be permitted (555). If 16 or more low to high transitions are not detected during that interval (530-N), pin 2 will be assigned to activate or deactivate a de-emphasis filter in response to the logic state applied to pin 2, and the internal serial clock mode will be selected (535) thus freeing pin 2 for use in activating the de-emphasis filter.

Figure 6:
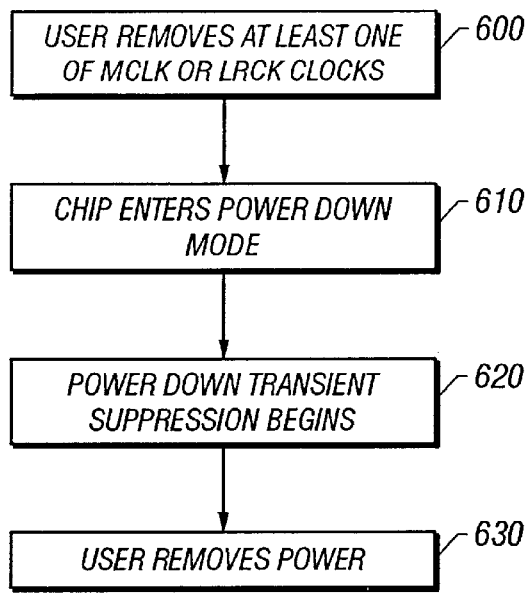
FIG. 6 is a flow chart showing an exemplary power-down sequence for an eight pin digital-to-analog converter shown in FIG. 2.

FIG. 6 is a flow chart showing an exemplary power-down sequence for an eight pin digital-to-analog converter as shown in FIG. 2. When the user removes at least one of MCLK or LRCK (600) the chip enters the power-down mode (610). At that time, power-down transient suppression begins as described more hereinafter (620). Finally, the user removes power completely (630) and the system shuts down.

Figure 7:
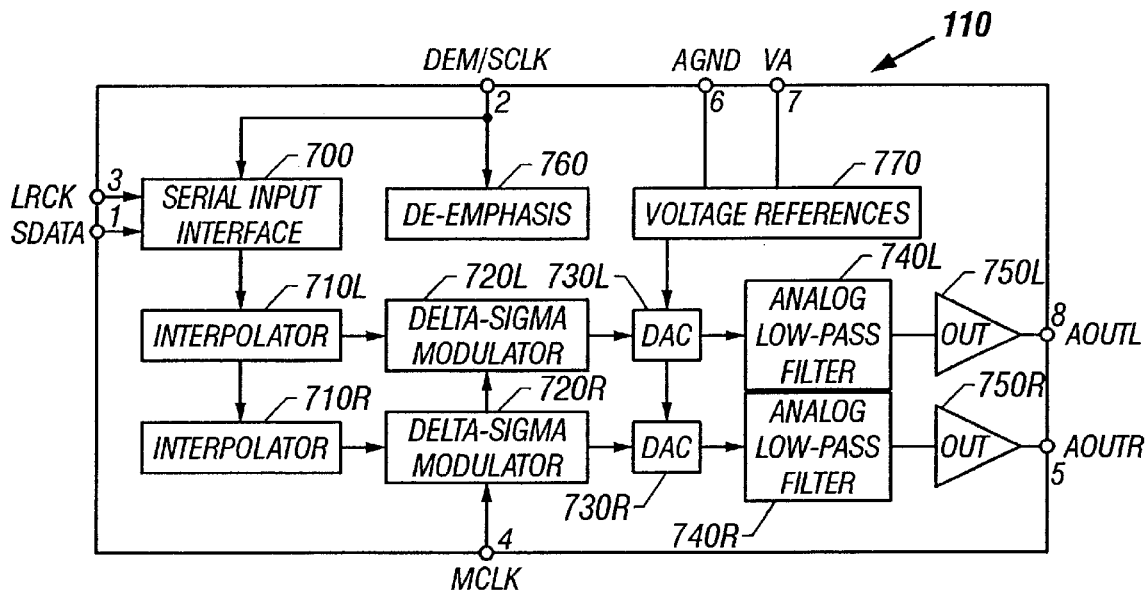
FIG. 7 is a block diagram of an exemplary eight pin digital-to-analog converter.

FIG. 7 is a block diagram showing an exemplary eight pin digital-to-analog converter in accordance with one embodiment of the invention. As shown in FIG. 7, the digital audio data (SDATA) comes in over pin 1 and is applied to serial input interface 700. The input interface 700 also receives LRCK over pin 3 and uses LRCK to determine whether or not the SDATA arriving will be directed to interpolator 740L or 740R. If an external SCLK is utilized, it will arrive over pin 2 and be applied to the serial input interface 700 as shown. As shown in FIG. 7, there are two audio tracks, a left and right audio track. The left track consists of interpolator 710, delta sigma modulator 720L, switched capacitor digital-to-analog convertor 730L, analog low-pass filter 740 and optional amplifier 750L. The right track is substantially identical and the left and right channel devices are distinguished by an L suffix or an R suffix, respectively. The left channel output AOUTL is provided at pin 8 of the chip. The right channel output AOUTR is provided at pin 5. If an external SCLK is not utilized, pin 2 of the chip is utilized to control the application of de-emphasis using block 760. Connections for de-emphasis are not shown in detail but are well known in the art. Pins 7 and 6 provide the power for the chip (VA) and the return (AGND), respectively. Supply voltage VA is utilized to provide voltage references (770) for DACs 730L and 730R.

Figure 8:
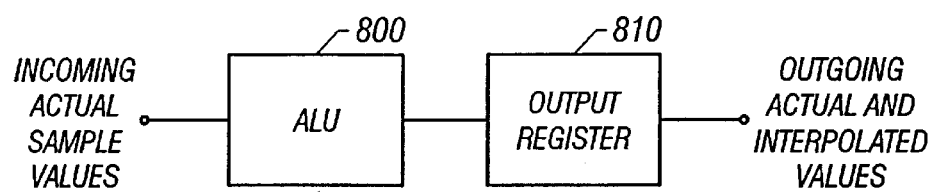
FIG. 8 is a block diagram showing an exemplary interpolator shown in FIG. 7.

FIG. 8 is a block diagram of an exemplary interpolator in accordance with the invention shown in FIG. 7. As shown in FIG. 8, an arithmetic logic unit (ALU) 800 receives the incoming actual sample values for the channel with which the interpolator is utilized. The ALU is associated with, either internally or externally, an output register 810. The interpolator provides a plurality of calculated intermediate samples in between each input sample. A number of interpolations algorithms can be used. The actual and interpolated values are passed to the delta sigma modulator.

Any of a number of different well-known circuits may be utilized for the delta sigma modulator.

Figure 9:
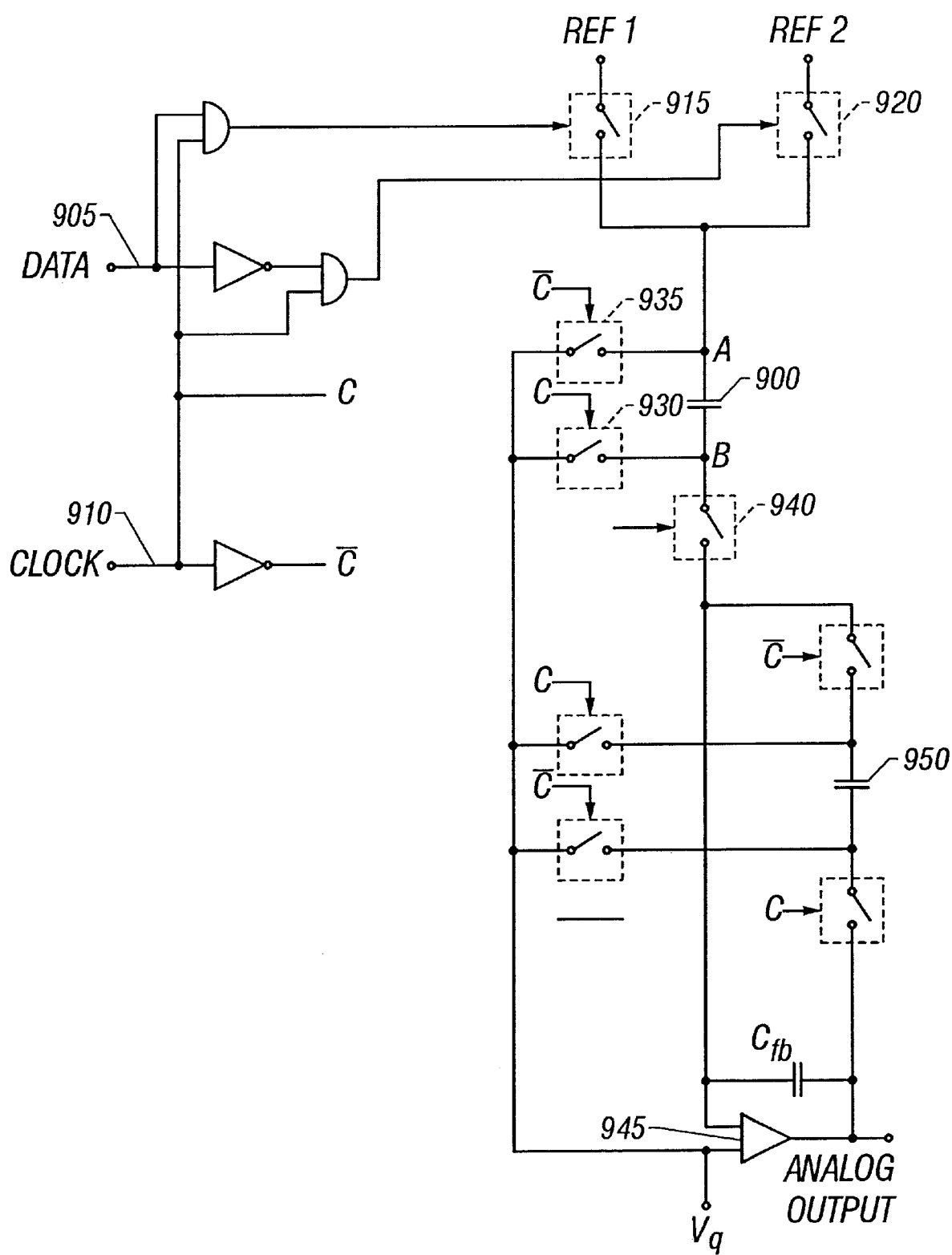
FIG. 9 is a block/schematic diagram of an exemplary switched capacitor digital-to-analog converter (DAC) shown in FIG. 7.

FIG. 9 is a block/schematic diagram of an exemplary DAC in accordance with the invention shown in FIG. 7. The DAC is, in a preferred form, a switched capacitor DAC. The DAC translates the bit data into a series of charge packets. The magnitude of the charge in each packet is determined by sampling of a voltage reference on to a switched capacitor 900, wherein the polarity of each packet is controlled by the one bit data (905). This technique greatly reduces the sensitivity to clock jitter and provides low-pass filtering of the output. Reference voltage 1 is connected to the switched capacitor 900 over switch 915 when both data and clock are high or reference 2 is connected when data is low (and clock high). Thus, reference 1 and reference 2 are selectively applied to side A capacitor 900 depending on the logic state of data line 905, while side B of capacitor 900 is held at voltage level $V_q$ by switch 930. When clock 910 is low, the B side of capacitor 900 is connected to one input of an integrating amplifier 945 by switch 940 and the charge is transferred to integrating capacitor $C_{fb}$. While side A of capacitor 900 is held at $V_q$ by switch 935. During one clock cycle, capacitor 950 removes a charge $Q = C_{950} \times V_{out}$ from $C_{fb}$. The charge is transferred to $C_{fb}$ by capacitor 900 is $Q = C900 \times V_{ref}$. Thus the DC gain of the switched capacitor filter is $$\frac{C_{900}}{C_{950}}.$$

Figure 10:
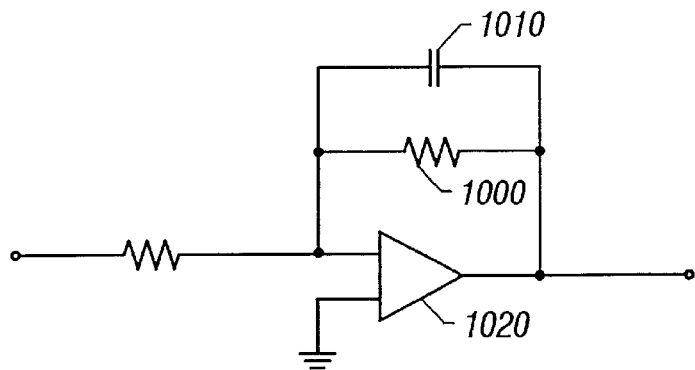
FIG. 10 is a schematic diagram of an exemplary analog low-pass filter and optional amplifier shown in FIG. 7.

FIG. 10 is a schematic diagram of an exemplary analog low-pass filter and optional amplifier in accordance with the invention shown in FIG. 7. As shown in FIG. 10, an analog low-pass filter consisting of resistor 1000 and capacitor 1010 is in the feedback path from the output of amplifier 1020 to a summing junction input. This arrangement serves to smooth the output and attenuate out of band noise.

Figure 11:
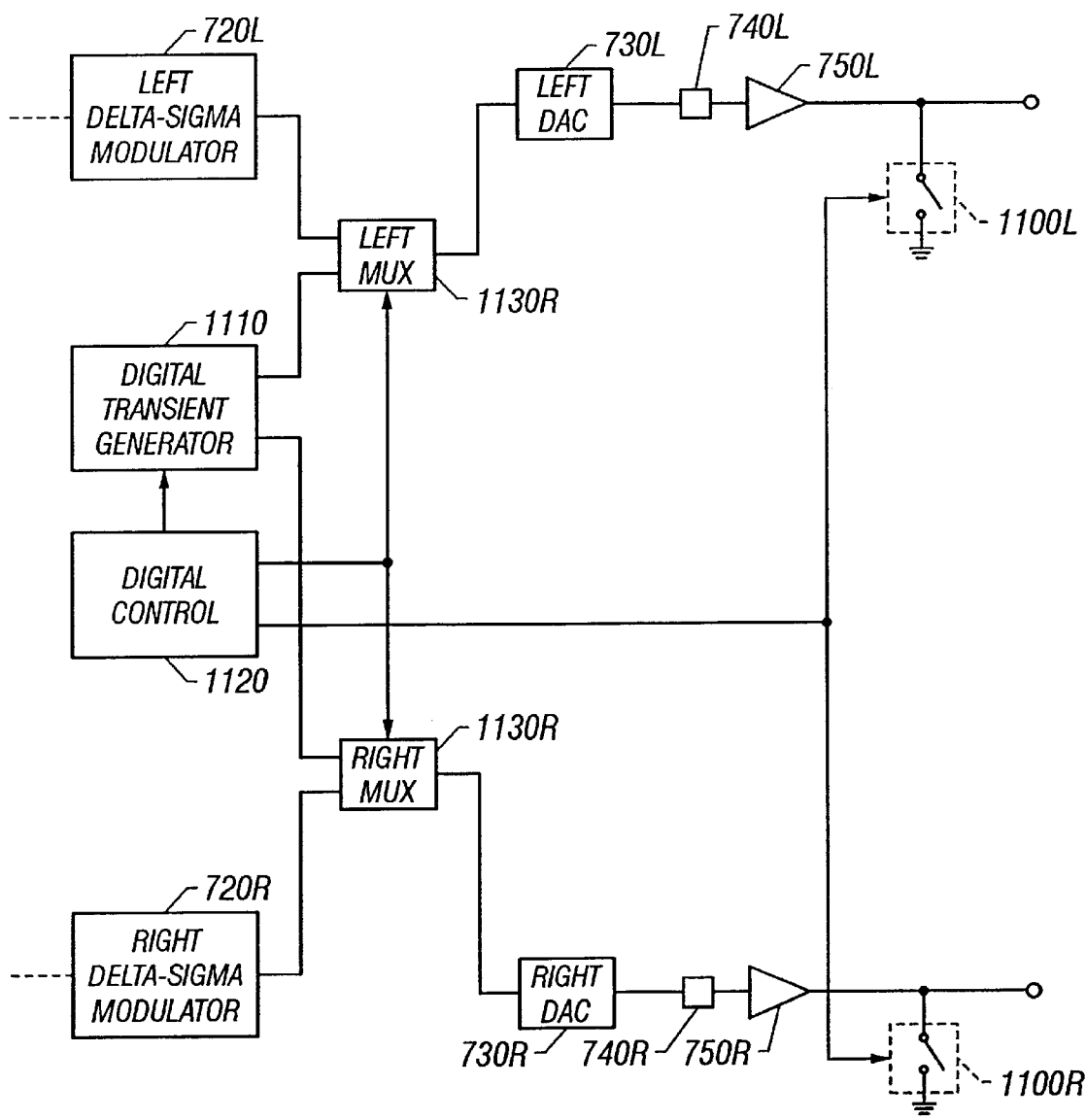
FIG. 11 is a block diagram of one embodiment of extensions to FIG. 7 to avoid a power-on transient pop.

FIG. 11 is a block diagram of one embodiment of extensions to FIG. 7 to avoid a power-on transient pop in accordance with the invention. Modulator 720, DAC 730, low-pass filter 740 and optional amplifier 750 for the left and right channels can be the corresponding items illustrated in FIG. 7. Note, however, that for purposes of transient suppression, the modulators can be any type of modulator and the DACs can be any types of DAC. As shown in FIG. 11, an output clamp 1100 can be activated to place the output pins at a ground potential under control of digital control 1120. A digital transient generator 1110 is utilized to generate a replacement function for what would otherwise be a loud pop at the output. The generator 1110 starts with a value, preferably as close to ground as possible. This value is applied over the respective left and right multiplexers or selectors 1330L/1330R to a respective left or right DAC 730L/730R. This places the output of amplifiers 750L/750R as close to ground as possible. Thus, the clamps 1100 can be opened and there will be no signals to create a loud pop in the output of audio system. The digital transient generator 1110 then increases the value in a gradual manner from ground to $V_q$ thus readying the audio channels 720, 730, 740 and 750 to receive incoming signal. When the output of amplifier 750 is at $V_q$, the digital control 1320 switches the multiplexer/selector to apply the output of the delta sigma modulator 720 to the DAC 730. As indicated above, if delta sigma modulation is not utilized, the output of the digital transient generator will be in a format suitable for the modulation and DAC utilized.

Figure 12:
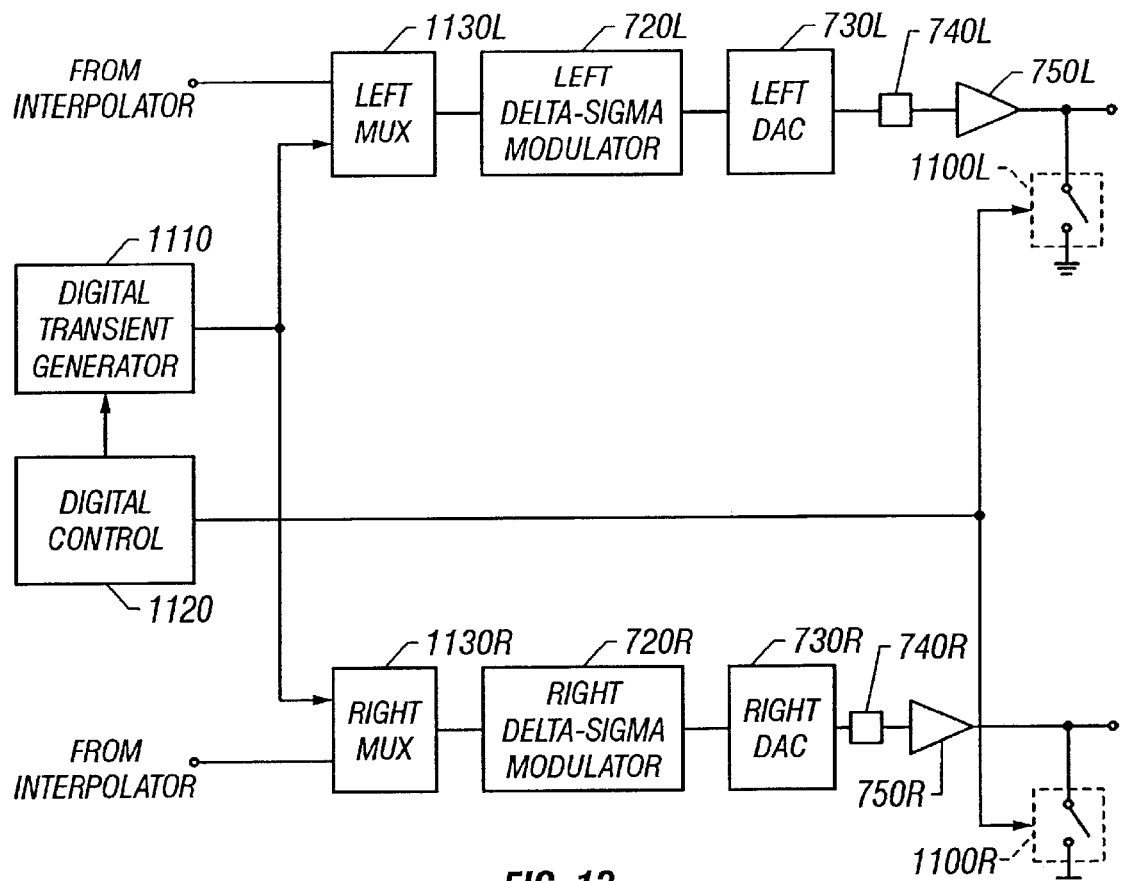
FIG. 12 is a block diagram of a second embodiment of extensions to FIG. 7 to avoid a power-on transient pop.

FIG. 12 is a block diagram of a second embodiment of extensions to FIG. 7 in accordance with the invention to avoid a power-on transient pop. The embodiment of FIG. 12 operates substantially identically to the circuit shown in FIG. 11, except that the output from the digital transient generator is inserted before the delta sigma modulator 720, rather than after. Thus, the multiplexers are inserted between the interpolator and the delta sigma modulators rather than between the delta sigma modulators and the DACs as shown in FIG. 11.

Figure 13:
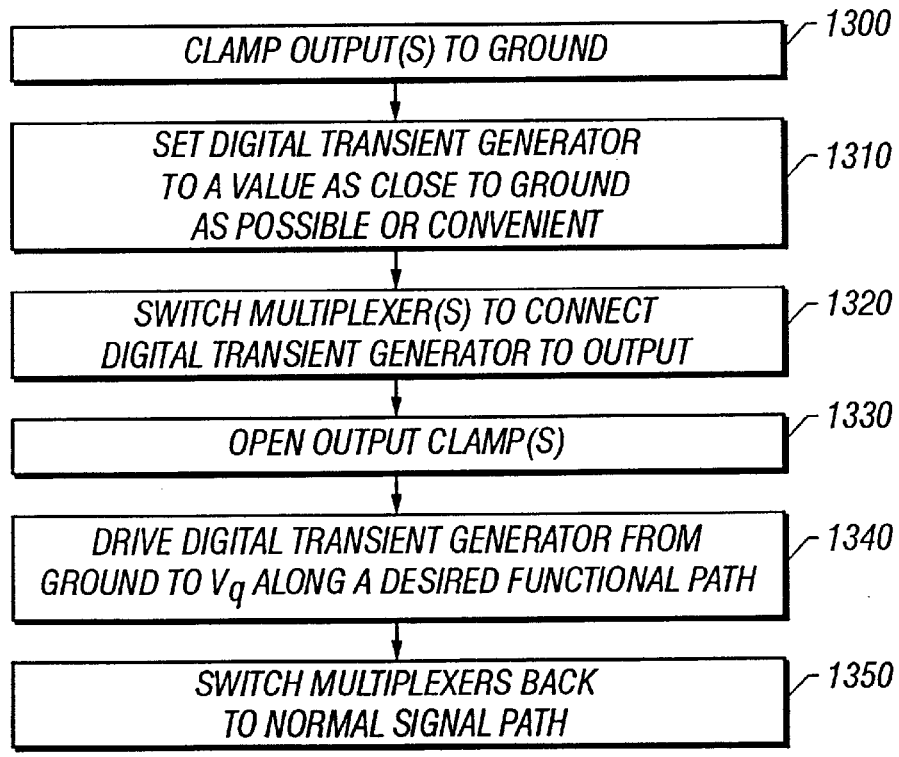
FIG. 13 is a flow chart of an exemplary process for operating the circuits of FIGS. 11 and 12.

FIG. 13 is an exemplary flow chart of a process for operating the circuits of FIGS. 11 and 12 in accordance with the invention. First, the digital control 1120 clamps the outputs to ground (1300). Then it sets the digital transient generator to a value as close to ground as possible or convenient (1310). The multiplexers are switched to connect the digital transient generator so that the digital transient generator produces a value at the output which approximates the ground potential to which the output is clamped (1320). Thus, with the output clamped to ground and the digital transient generator set to provide an output value equivalent to ground, when the output clamps are released (1330) there is no pop in the speakers or the output of the audio path. The digital transient generator can then be driven from ground to voltage $V_q$ along a desired functional path (1340) and the multiplexer switched back to the normal signal path (1350).

Figure 14:
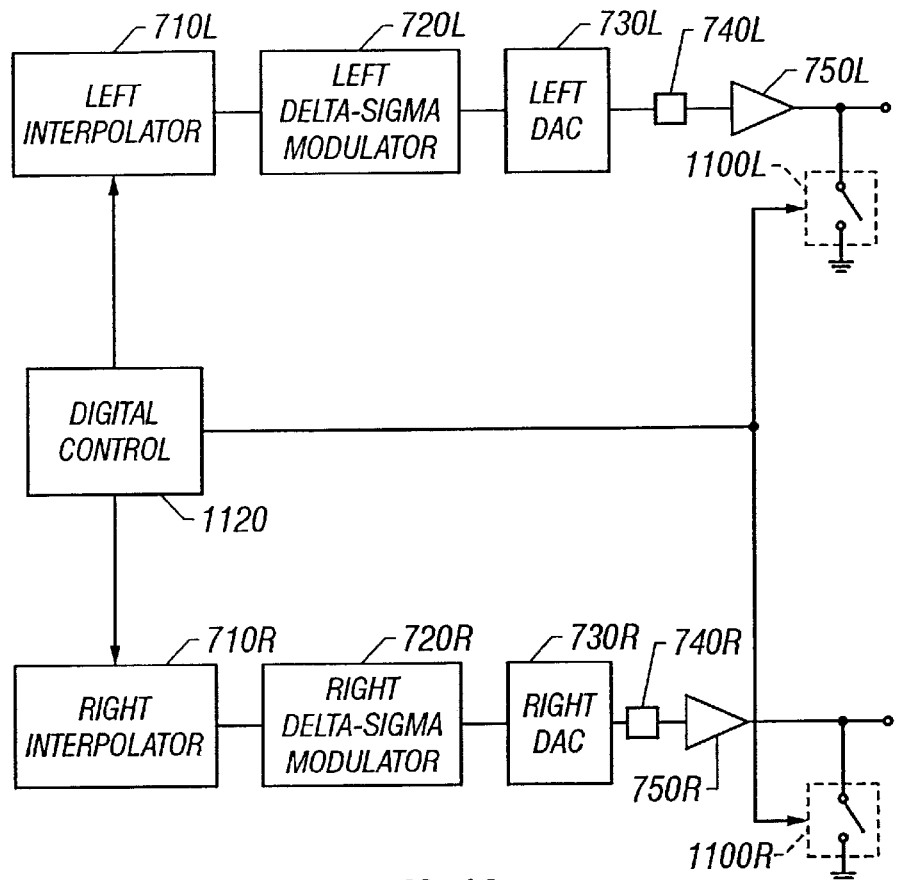
FIG. 14 is a block diagram of a preferred embodiment of extensions to FIG. 7 to avoid a power-on transient pop.

FIG. 14 is a block diagram of a preferred embodiment of extensions to FIG. 7 in accordance with the invention to avoid a power-on transient pop. In this embodiment, interpolators 710 are utilized to perform the function of digital transient generator 1110 shown in the other embodiments. As shown in FIG. 8, the preferred interpolator includes an arithmetic logic unit 800 and an output register 810. The ALU 800 can do more than just calculate interpolated values. It can perform a variety of mathematical operations.

Figure 15:
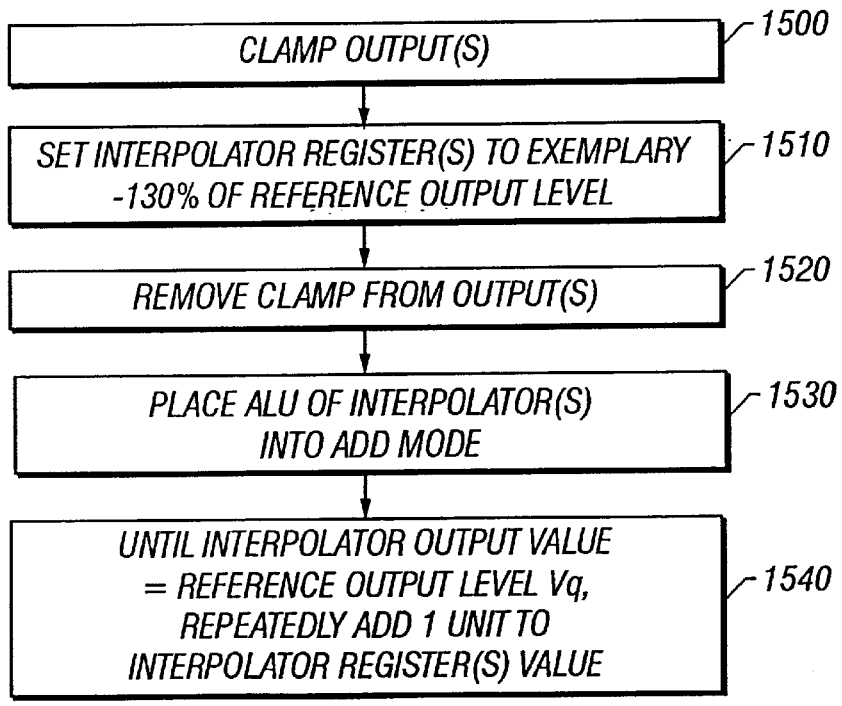
FIG. 15 is a flow chart of an exemplary process for operating the circuit of FIG. 14.

FIG. 15 is an exemplary flow chart of a process for operating the circuit of FIG. 14 in accordance with the invention utilizing the interpolator as a digital transient generator. As before, the digital control 1120 causes the outputs to be clamped to ground using switches 1100 (1700).

The interpolator output register is then set to an exemplary −130% of the expected signal swing above or below $V_q$ (1510). This places the output of the interpolator as close to ground as possible. This results in the signal propagating through the audio channels being at approximately ground. Therefore, when the clamps are removed (1520), there will be no pop on the output. The ALU of the interpolator(s) is then placed into an add mode (1530) and a predetermined value (e.g. a unit value) added repeatedly to the value in the output register until the output value equals the reference output level, $V_q$ (1540). In this way, the interpolator(s) function to bring the output level from ground to $V_q$ without the unpleasant pop of the prior art.

Figure 16:
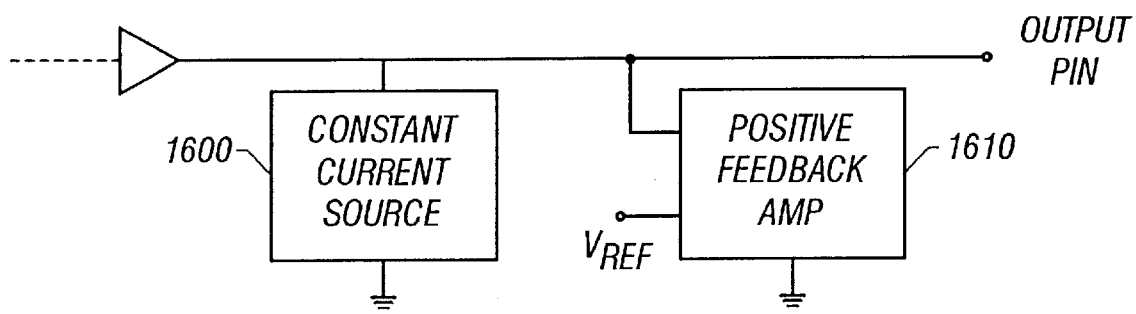
FIG. 16 is a block diagram of an exemplary extension to FIG. 7 to avoid a power-off transient pop.

FIG. 16 is a block diagram of an exemplary circuit used as an extension to FIG. 7 in accordance with the invention to avoid a power-off transient pop. FIG. 16 illustrates one embodiment of circuitry utilized to implement step 620 of the process shown in FIG. 6. As described previously, the output pins AOUTL and AOUTR, respectively pins 8 and 5, are set at a nominal $V_q$ upon power-up. Thus, the off-chip filters 115, shown in FIG. 2, are charged essentially to a nominal $V_q$ level. In the power-down state, the charge would normally remain on the off-chip filters 115 and until power was removed by turning off the device. The discharge from the off-chip filters on turn off can result in a pop analogous to that experienced during power-on. To avoid this, when the circuit enters the power-down state, a current driver, such as a constant current source (1600) begins draining current from the output pin to discharge the off-chip filter. The current drain could operate by itself to discharge the DC blocking capacitor. However it is preferred that the current drain work together with a supplemental circuit, such as the positive feedback amplifier 1810 shown, to accelerate the current flow begun by the current drain. It is not necessary that the supplemental circuit have positive feedback, but it is desirable.

Figure 17:
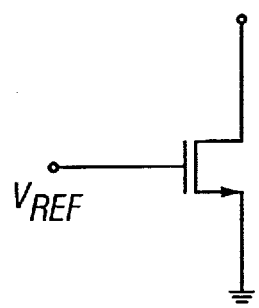
FIG. 17 is a schematic diagram of one implementation of a constant current source shown in FIG. 16.

FIG. 17 is a schematic diagram of an exemplary constant current source shown in FIG. 16 in accordance with the invention. Almost any constant current source will do. However, the FET shown in FIG. 17 is a convenient way to implement the source.

Figure 18A:
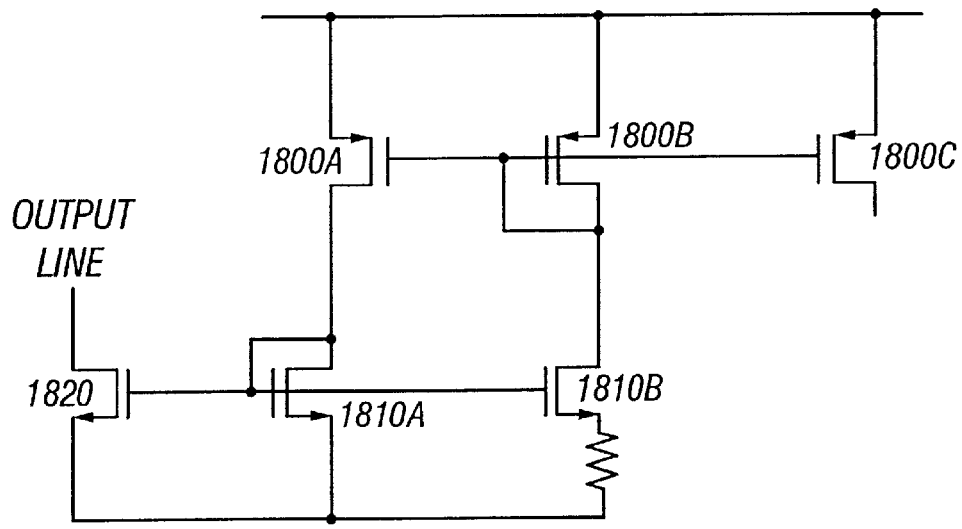
FIG. 18A is a schematic diagram of a preferred constant current source shown in FIG. 16.

FIG. 18A is a schematic diagram of a preferred constant current source shown in FIG. 16 in accordance with the invention. FETs 1800A, 1800B, 1810A and 1810B form a reference current generator which controls the current flowing in current drain 1820 to render it substantially constant.

Figure 18B:
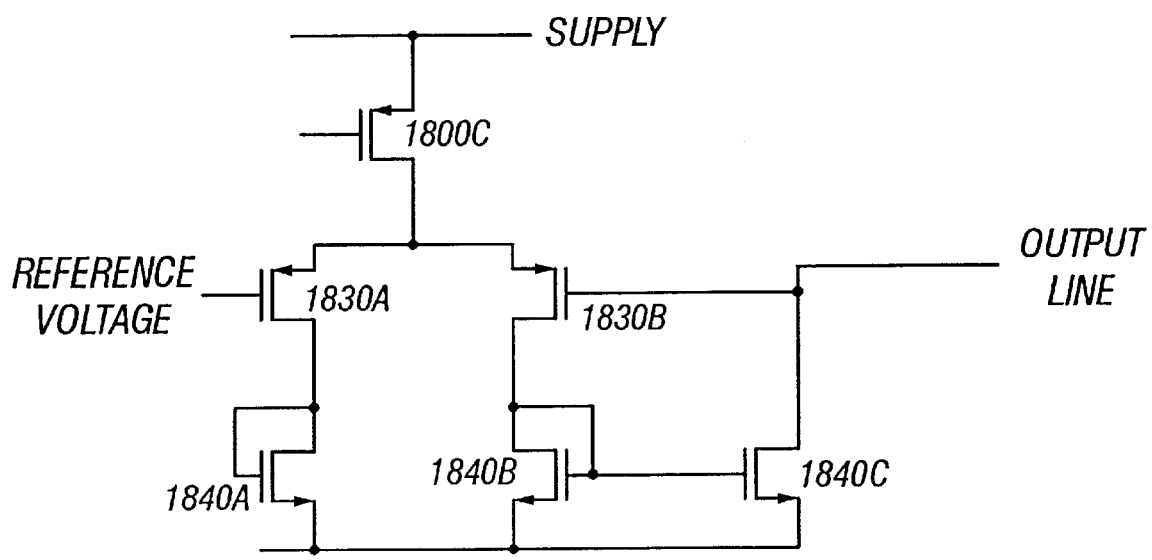
FIG. 18B is a schematic diagram of a preferred positive feedback amplifier shown in FIG. 16.

FIG. 18B is a schematic diagram of an exemplary preferred positive feedback amplifier shown in FIG. 16 in accordance with the invention. When the device is put into a power-down state, device 1820 begins discharging the large off-chip capacitor. This flow is reflected in device 1800C and used in 1830A, 1830B, 1840A and 1840B to drive 1840C to accelerate the discharge. Thus, the output voltage decreases slowly at first, then accelerates due to positive feedback.

Although the present invention has been described and illustrated in detail, it is clearly understood that the same is by way of illustration and example only and is not to be taken by way of limitation, the spirit and scope of the present invention being limited only by the terms of the appended claims and their equivalents.

What is claimed is:

1. A digital-to-analog converter, comprising:
   a. an input receiving a digital information signal containing information from at least two sources and converting the digital information signal into a respective analog signal for each source; and
   b. a mode selection circuit for setting an operating mode for the digital-to-analog converter based on the values of a master clock associated with the digital information signal and a clock associated with separating the at least two sources into respective analog signals.

2. The digital-to-analog converter of claim 1 wherein said mode selection circuit selects between at least a first operating mode and a second operating mode based on incoming signal transition rates.

3. The digital-to-analog converter of claim 1 wherein said mode selection circuit selects between a base sampling rate mode and a high sampling rate mode.

4. The digital-to-analog converter of claim 3 wherein:
   a base sampling rate for the base sampling rate mode is selected from the group consisting of a 32 kHz rate, a 44.1 kHz rate, and a 48 kHz rate; and
   a high sampling rate for the high sampling rate mode is selected from the group consisting of a 64 kHz rate, an 88.2 kHz rate, and a 96 kHz rate.

5. The digital-to-analog converter of claim 3 wherein the high sampling rate mode utilizes a high sampling rate which is twice as fast as a base sampling rate utilized by the base sampling rate mode.

6. The digital-to-analog converter of claim 3 wherein said mode selection circuit sets the operating mode based on a ratio of a frequency of the master clock to a frequency of the clock associated with separating the at least two sources.

7. The digital-to-analog converter of claim 6 wherein said mode selection circuit detects the ratio during an initialization sequence by counting a number of master clock transitions during a single period of the clock associated with separating the at least two sources.

8. The digital-to-analog converter of claim 6 wherein said mode selection circuit selects a base sampling rate mode when the ratio is 256 or greater.

9. The digital-to-analog converter of claim 6 wherein said mode selection circuit selects a high sampling rate mode when the ratio is 192 or greater.

10. The digital-to-analog converter of claim 6 wherein said mode selection circuit selects between a base sampling rate mode and a high sampling rate mode.

11. A method of operating a digital-to-analog converter, comprising the step of:
   using incoming signal transition rates to establish an operating mode for the digital-to-analog converter, wherein said step of using incoming signal transition rates to establish an operating mode includes the step of setting the operating mode based on a ratio of a frequency of a master clock signal to a frequency of a clock associated with separating a digital information signal into at least two analog signals.

12. The method of claim 11 further comprising the step of detecting the ratio during an initialization sequence by counting a number of master clock transitions during a single period of the clock associated with separating the at least two sources.

13. The method of claim 11 further comprising the step of selecting a base sampling rate mode when the ratio is 256 or greater.

14. The method of claim 11 further comprising the step of selecting a high sampling rate mode when the ratio is 192 or greater.

15. A method of operating a digital-to-analog converter, comprising the step of:
   using incoming signal transition rates to establish an operating mode for the digital-to-analog converter, wherein said step of using incoming signal transition rates to establish an operating mode includes the step of selecting between a base sampling rate mode and a high sampling rate mode, and wherein the high sampling rate mode utilizes a high sampling rate which is twice as fast as a base sampling rate utilized by the base sampling rate mode.

* * * * *

UNITED STATES PATENT AND TRADEMARK OFFICE
CERTIFICATE OF CORRECTION

PATENT NO. : 6,492,928 B1
DATED : December 10, 2002
INVENTOR(S) : Jason P. Rhode et al.

It is certified that error appears in the above-identified patent and that said Letters Patent is hereby corrected as shown below:

Title page,
Item [75], Inventors, should be:

-- Jason P. Rhode, Austin, TX (US);
John J. Paulos, Austin, TX (US);
Andrew W. Krone, Austin, TX (US) --

Signed and Sealed this

Twenty-third Day of November, 2004

JON W. DUDAS
*Director of the United States Patent and Trademark Office*